United States Patent
Zhang et al.

(10) Patent No.: US 9,614,500 B2
(45) Date of Patent: Apr. 4, 2017

(54) ELECTRONIC CIRCUIT, ELECTRONIC APPARATUS, AND METHOD FOR ELIMINATING METASTABILITY

(71) Applicant: SEMICONDUCTOR MANUFACTURING INTERNATIONAL (SHANGHAI) CORPORATION, Shanghai (CN)

(72) Inventors: Jing Zhang, Beijing (CN); Wei Fang, Beijing (CN); Jindong Pan, Beijing (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/733,955

(22) Filed: Jun. 8, 2015

(65) Prior Publication Data

US 2016/0049926 A1    Feb. 18, 2016

(30) Foreign Application Priority Data

Aug. 18, 2014    (CN) .......................... 2014 1 0407383

(51) Int. Cl.
    *H03K 3/00*      (2006.01)
    *H03K 3/037*     (2006.01)

(52) U.S. Cl.
    CPC ................................ *H03K 3/0375* (2013.01)

(58) Field of Classification Search
None
See application file for complete search history.

(56) References Cited

U.S. PATENT DOCUMENTS

| | | | | |
|---|---|---|---|---|
| 6,127,864 A * | 10/2000 | Mavis | ................. | H03K 3/0375 327/295 |
| 7,411,437 B2 * | 8/2008 | Vook | ......................... | G06F 1/04 327/295 |
| 7,652,514 B2 * | 1/2010 | Lee | ........................ | H03H 11/26 327/296 |
| 8,295,121 B2 * | 10/2012 | Kim | ........................ | G11C 7/22 327/153 |
| 2009/0184735 A1 * | 7/2009 | Wicki | ....................... | G06F 1/08 327/9 |
| 2010/0316142 A1 * | 12/2010 | Tsuchiya | ............. | G06F 17/5045 375/259 |

* cited by examiner

*Primary Examiner* — Long Nguyen
(74) *Attorney, Agent, or Firm* — Kilpatrick Townsend and Stockton LLP

(57) ABSTRACT

An electronic circuit includes a clock control unit having a first input for receiving a first clock signal, a second input for receiving a second clock signal, a first clock output, and a second clock output, a first flip-flop having a first data input, a first clock input connected to the first clock output, and a first output, and a second flip-flop having a second data input, a second clock input connected to the second clock output, and a second data input connected to the first output of the first flip-flop. The clock control unit provides the first clock signal to the first clock input of the first flip-flop through the first clock output and the second clock signal to the clock input of the second flip-flop through the second clock output terminal in a sequential order.

17 Claims, 2 Drawing Sheets

ELECTRONIC CIRCUIT, ELECTRONIC APPARATUS, AND METHOD FOR ELIMINATING METASTABILITY

CROSS-REFERENCES TO RELATED APPLICATIONS

This application claims priority to Chinese patent application No. 201410407383.4, filed on Aug. 18, 2014, the content of which is incorporated herein by reference in its entirety.

BACKGROUND OF THE INVENTION

The present invention relates to an electronic circuit, electronic apparatus and method for elimination metastability.

In digital integrated circuits, there is a need for synchronization of signals when transmitting signals between asynchronous clock domains. If the signals are not synchronized, and the setup and hold time of a flip-flop is not met, the output of the flip-flop may be in a metastable state. In this case, the output Q of the flip-flop may be in an indefinite state for a relatively long period of time after the active clock edge, the output Q of the flip-flop may have glitches, oscillation or an undefined voltage value, instead of being equal to the value of the signal at the input D of the flip-flop.

Since the metastable state of a flip-flop may affect greatly the correct function of a digital circuit, there is a need to eliminate the metastable state so that signals across different clock domains can be sampled correctly.

Some techniques have been proposed to solve the problems of metastability, however, they have some limitations and are not reliable. FIG. 1 is a conventional circuit that is commonly used for solving the problems of metastability, as known in the prior art. The circuit includes two flip-flops that are connected sequentially and can cause metastability to die out between them. However, the sequentially connected flip-flops can reduce but not completely eliminate metastability.

As is described above, the prior art circuit cannot completely eliminate the problems of metastability when a data signal from one clock domain (denoted "first clock domain"), driven by a first local clock signal (denoted "CLK1") is sent to another clock domain (denoted "second clock domain") having a second clock signal (denoted "CLK2"), problems of metastability may occur when the transition of the data signal takes place during the active edge of the second clock signal, i.e., the data signal cannot be correctly sampled and the output value of the receiving flip-flop cannot be relied upon. Therefore, there is a need for a novel electronic circuit, apparatus, and method that can completely eliminates metastability.

BRIEF SUMMARY OF THE INVENTION

Embodiments of the present invention provide an electronic circuit, which includes a clock control unit comprising a first clock input terminal for receiving a first clock signal, a second clock input terminal for receiving a second clock signal, a first clock output terminal, and a second clock output terminal, a first flip-flop comprising a first data input terminal, a first clock input terminal connected to the first clock output terminal, and a first output terminal, and a second flip-flop comprising a second data input terminal, a second clock input terminal connected to the second clock output terminal, and a second data input terminal connected to the first output terminal of the first flip-flop. The clock control unit provides the first clock signal to the first clock input terminal of the first flip-flop through the first clock output terminal and the second clock signal to the clock input terminal of the second flip-flop through the second clock output terminal in a sequential order.

In an embodiment, the clock control unit further includes an enable input terminal for receiving an enable signal and is configured to provide the first clock signal to the first clock input terminal of the first flip-flop through the first clock output terminal when the enable signal has a first logical state, and provide the second clock signal to the second clock input terminal of the second flip-flop through the second clock output terminal when the enable signal has a second, opposite logical state.

In an embodiment, when the enable signal has the first logical state, the first clock signal passes through the clock control unit, the second clock signal does not pass through the clock control signal unit, the passed through first clock signal causing the first flip-flop to pass a data signal at the first data input terminal to the first output terminal, and when the enable signal has the second logical state, the first clock signal does not pass through the clock control unit, the second clock signal passes through the clock control unit causing the second flip-flop to process the data signal.

In an embodiment, the enable signal and the first clock signal are located in a same clock domain and are substantially synchronous with respect to each other, and the first and second clock signals are located in different clock domains and are asynchronous with respect to each other.

In an embodiment, the first flip-flop and the second flip-flop are D flip-flops.

In an embodiment, the clock control unit includes an inverter, a first multiplexer having a first select input terminal, and a second multiplexer having a second selected input terminal connected to the first selected terminal through the inverter.

In an embodiment, the first select input terminal or the second select terminal is an enable input terminal of the clock control unit.

In an embodiment, the first multiplexer comprises a first input terminal being the first clock input terminal of the clock control unit and a second input terminal being connected to a logical low level; and the second multiplexer comprises a second input terminal being the second input terminal of the clock control unit and a second input terminal connected to the logical low level.

Embodiments of the present invention provide a method for eliminating metastability of a digital system that may include a first clock domain operating with a first clock frequency and a second clock domain operating with a second clock frequency. The digital system may include a circuit comprises a clock control unit, a first flip-flop, and a second flip-flop. The method may include, in a sequential order, activating the first flip-flop and deactivating the second flip-flop to transmit a data signal from the first flip-flop to the second flip-flop, and deactivating the first flip-flop and activating the second flip-flop to process the transmitted data signal by the second flip-flop.

In an embodiment, activating the first flip-flop and deactivating the second flip-flop include receiving an enable signal having a first logical state by the clock control unit, and deactivating the first flip-flop and activating the second flip-flop include receiving the enable signal having a second logical state that is opposite from the first logical state.

In an embodiment, the enable signal and the first clock signal are located in the same first clock domain and substantially synchronous with respect to each other. The second clock signal in the second clock domain is asynchronous with respect to the first clock signal in the first clock domain.

In an embodiment, the method may further include receiving the first clock signal at a first input terminal of a first multiplexer, which has a second input terminal connected to a logical low level (e.g., "0"), and receiving the second clock input at a first input terminal of a second multiplexer, which has a second input terminal connected to the logical low level.

In an embodiment, the method also include enabling the first multiplexer to provide the first clock signal to the first flip-flop and the second multiplexer to provide the logical low level to the second flip-flop in response to the first logical state of the enable signal, and enabling the first multiplexer to provide the logical low level to the first flip-flop and the second multiplexer to provide the second clock signal to the second flip-flop in response to the second logical state of the enable signal.

The following description, together with the accompanying drawings, will provide a better understanding of the nature and advantages of the claimed invention.

DETAILED DESCRIPTION OF THE INVENTION

Figure 1:
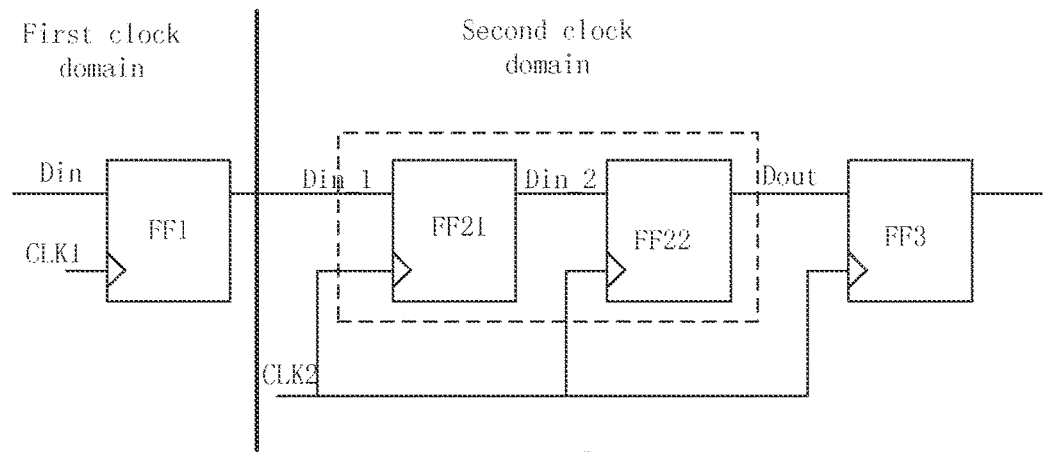
FIG. 1 is a simplified schematic of a conventional circuit for reducing metastability according to the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "overlying," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terms "a", "an" and "the" may include singular and plural references. It will be further understood that the terms "comprising", "including", having", "containing" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiment 1

Figure 2:
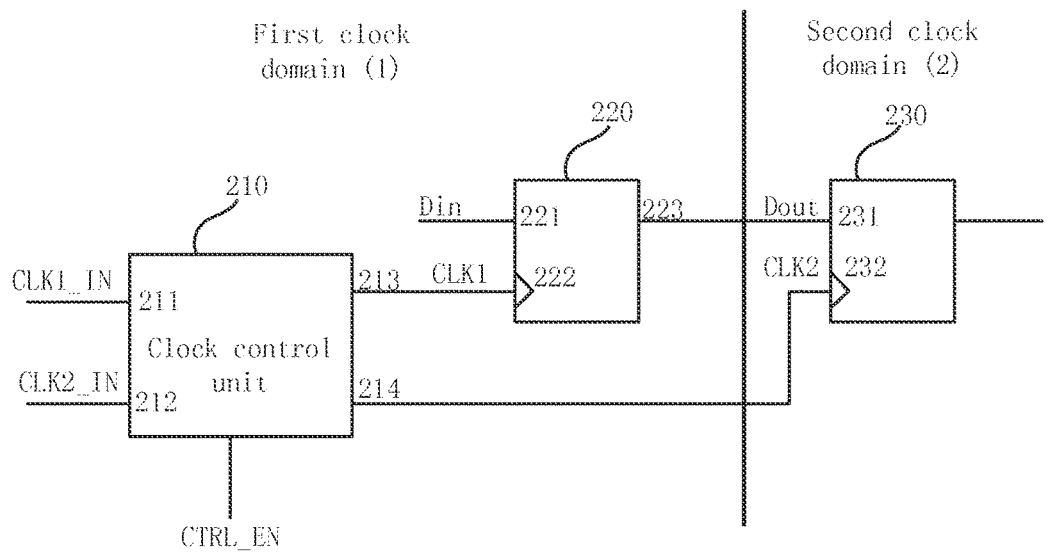
FIG. 2 is a simplified schematic of a digital circuit for eliminating metastability according to an embodiment of the present invention.
Figure 3:
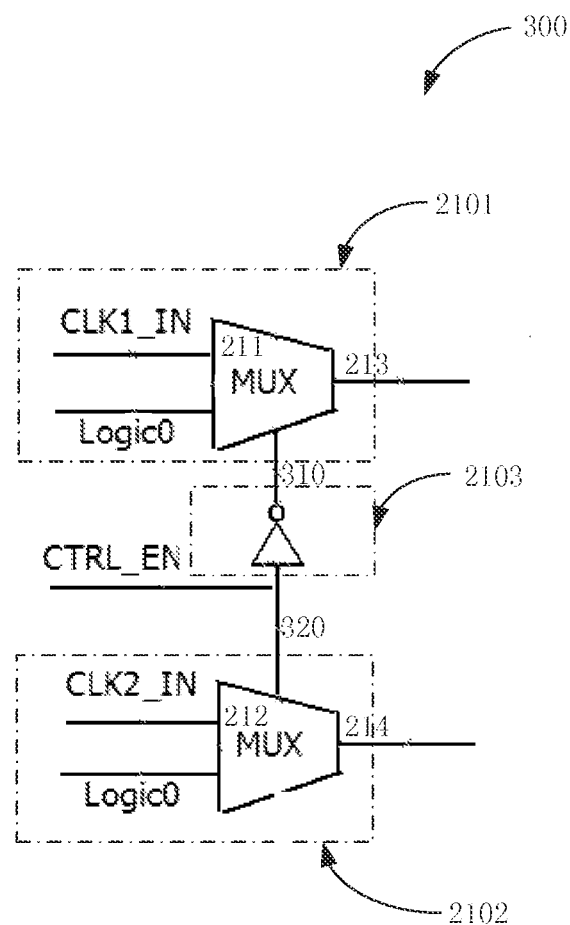
FIG. 3 is a simplified schematic of a clock control unit according to an embodiment of the present invention.

Embodiments of the present invention provide an electronic circuit that can be used to eliminate metastability. In particular, the electronic circuit can completely eliminate metastability when a low frequency signal traverses to a high frequency domain. The electronic circuit operates stably and reliably. FIG. 2 is a simplified block diagram of an electronic circuit according to an embodiment of the present invention. FIG. 3 is a simplified block diagram of a clock control unit according to an embodiment of the present invention.

Referring to FIG. 2, a circuit 200 includes a clock control unit 210, a first flip-flop 220, and a second flip-flop 230. Clock control unit 210 has a first output terminal 213 connected to a clock input 222 of first flip-flop 220 and a second output terminal 214 connected to a clock input 232 of second flip-flop 230. First flip-flop 220 has a data input 221 configured to receive a data signal Din and an output terminal 223 connected to a data input 231 of second flip-flop 230. First flip-flop 220 and second flip-flop 230 may be a D-flip-flop or other types of flip-flops.

Clock control unit 210 includes a first input terminal 211 configured to receive a first input clock signal CLK1_IN, a second input terminal 212 configured to receive a second input clock signal CLK2_IN, and an enable terminal CTRL_EN (which is also referred to as enable signal of clock control unit 210 in the present disclosure). Clock control unit 210 is configured to provide in a chronological (sequential) order a clock signal CLK1 and a clock signal CLK2 to respective input clock terminal 222 of first flip-flop 220 and input clock terminal 232 of second flip-flop 230.

In a specific embodiment, through the control of the enable terminal CTRL_EN of clock control unit 210, input clock signal CLK1_IN can be provided as an output signal CLK1 at output terminal 213 and input clock signal CLK2_IN can be provided as an output signal CLK2 at output terminal 214 of clock control unit 210.

In the embodiment, since first flip-flop 220 and second flip-flop 230 receive different clock signals CLK1 and CLK2, respectively, thus, first flip-flop 220 can be located in first clock region 1 (alternatively referred to as first clock domain 1 or first clock domain) and second flip-flop 230 can be located in second clock region 2, as shown in FIG. 2. In accordance with the present invention, a signal in first clock region 1 can be transmitted to second clock region 2 (alternatively referred to as second clock domain 2 or second clock domain) without the occurrence of metastability. The principle is as follows: Firstly, the signal to be processed Din in first clock region 1 is stored in first flip-flop 220, and then second clock region 2 is activated to process the signal Dout provided by first flip-flop 210.

In particular, the core idea of electronic circuit 200 of FIG. 2 is based on time-sharing work. Referring to FIG. 2, first input clock signal CLK1_IN is passed through clock control unit 210 under the control of clock enable terminal CTRL_EN as first clock signal CLK1. First clock signal CLK1 is provided to first flip-flop 220 causing data signal Din to pass through first flip-flop 220 as an output signal Dout and provided to input terminal 231 of second flip-flop 230. At this time, clock control signal 210 does not output second clock signal CLK2 so that second flip-flop 230 is inactive (will not be operated since it does not receive second clock signal CLK2). Then, second input clock signal CLK2_IN is passed through clock control unit 210 under the control of clock enable terminal CTRL_EN as second clock signal CLK2. Second clock signal CLK2 is provided to second flip-flop 230 causing second flip-flop to be active to process the output signal Dout. At this time, first output terminal 213 of clock control unit 210 does not output clock signal CLK1 so that first flip-flop 220 is inactive (will not be operated since it does not receive clock signal CLK1). That is, under the control of clock control unit 210, when second flip-flop 230 is operated (active, turned on), clock signal CLK1 is not provided to first flip-flop 220. Thus, circuit 200 of FIG. 2 can satisfy the setup and hold time requirements of the flip-flops and no metastability will occur.

In accordance with the present invention, when data signals of the above-described circuit in FIG. 2 are transmitted from a low frequency region to a high frequency region, problems of metastability can be completely eliminated, and stability and high reliability of the circuit can be ensured.

In the embodiment, through the control of clock control unit 210, circuit 200 can be operated as follows: Firstly, first flip-flop 220 in first clock domain 1 stops operating after transferring data signal Din as output signal Dout to second flip-flop 230 in second clock domain 2; then second flip-flop 230 starts operating. Circuit 200 ensures that CLK2 can correctly sample data signal Dout in second flip-flop 230 so that the problems of metastability will not occur.

FIG. 3 is a simplified block diagram of a circuit 300 implementing clock control unit 210 according to an embodiment of the present invention. Referring to FIG. 3, circuit 300 can alternatively provide either CLK1_IN or CLK2_IN as output signal CLK1 or CLK2. Circuit 300 includes a first multiplexer (MUX) 2101, a second multiplexer (MUX) 2102, and an inverter 2103. First multiplexer 2101 is a 2:1 multiplexer having a first input terminal 211 connected to clock signal CLK1_IN, a second input terminal connected to Logic0, and a selection input connected to an output of inverter 2103. Second multiplexer 2102 is a 2:1 multiplexer having a first input terminal 212 connected to clock signal CLK2_IN, a second input terminal connected to Logic0, and a selection input connected to control enable terminal CTRL_EN of clock control unit 210. Control enable terminal CTRL_EN is connected to an input terminal of inverter 2103. Alternatively, the selection input of first multiplexer 2101 can be connected to control enable terminal CTRL_EN, and the selection input of second multiplexer 2102 can be connected to the output of inverter 2103. First multiplexer 2101 can select one of the CLK1_IN and Logic0 signals in accordance with a select signal 310. Second multiplexer 2102 can select one of the CLK2_IN and Logic0 signals as output signal in accordance with a select signal 320. In an embodiment, Logic0 is connected to a logical low level (e.g., "0").

Due to the presence of inverter 2103, select signal 310 and select signal 320 are complementary to each other (i.e., have opposite values) so that first and second multiplexers 2101, 2102 will not concurrently (simultaneously) output CLK1 and CLK2.

In a specific embodiment, clock control unit 210 or circuit 300 operates as follows: CTRL_EN is set to logic low ("0") so that the first clock input signal CLK1_IN applied to the first input of first multiplexer 2101 passes through first multiplexer 2101 to first output terminal 213 as output signal CLK1, auxiliary signal Logic0 applied to the second input of second multiplexer 2102 passes through as logic low signal ("0") to second output terminal 214 of clock control unit 210. Thereafter, CTRL_EN is set to logic high ("1") so that the auxiliary signal Logic0 applied to the second input of first multiplexer 2101 is outputted from clock control unit at first output terminal 213, and the second clock input signal CLK2_IN applied to second input terminal 212 of clock control unit 210 is outputted at second output terminal 214 as signal CLK2. CTRL_EN is located in the same first clock region (domain) as the first clock input signal CLK1_IN and is substantially synchronous with respect to the first clock input signal.

Circuit 300 shown in FIG. 3 can implement the function of clock control unit 210 of FIG. 2. Of course, those skilled in the art appreciate that other alternative configurations are also possible.

In accordance with the present invention, clock control unit 210 may eliminate race conditions of asynchronous signals from two different asynchronous clock domains by ensuring that when second flip-flop 230 is active, first flip-flop 220 does not receive a clock signal so that setup and hold time requirements are always met, thereby preventing metastability from occurring.

Embodiments of the present invention provide a method for eliminating metastability of a digital system that may include a first clock domain operating with a first clock frequency and a second clock domain operating with a second clock frequency. The digital system may include a circuit comprises a clock control unit, a first flip-flop, and a second flip-flop. The method may include, in a sequential order, activating the first flip-flop and deactivating the second flip-flop to transmit a data signal from the first flip-flop to the second flip-flop, and deactivating the first flip-flop and activating the second flip-flop to process the transmitted data signal by the second flip-flop.

In an embodiment, activating the first flip-flop and deactivating the second flip-flop include receiving an enable signal having a first logical state by the clock control unit, and deactivating the first flip-flop and activating the second flip-flop include receiving the enable signal having a second logical state that is opposite from the first logical state.

In an embodiment, the enable signal and the first clock signal are located in the same first clock domain and substantially synchronous with respect to each other. The second clock signal in the second clock domain is asynchronous with respect to the first clock signal in the first clock domain.

In an embodiment, the method may further include receiving the first clock signal at a first input terminal of a first multiplexer, which has a second input terminal connected to a logical low level, and receiving the second clock input at a first input terminal of a second multiplexer, which has a second input terminal connected to the logical low level.

In an embodiment, the method also include enabling the first multiplexer to provide the first clock signal to the first flip-flop and the second multiplexer to provide the logical low level to the second flip-flop in response to the first logical state of the enable signal, and enabling the first multiplexer to provide the logical low level to the first flip-flop and the second multiplexer to provide the second clock signal to the second flip-flop in response to the second logical state of the enable signal.

Embodiment 2

Embodiments of the present invention provide an electronic device, which may include one or more semiconductor devices that include one or more of the above-described electronic circuits. In an embodiment, an electronic circuit may include a clock control unit, a first flip-flop and a second flip-flop. The clock control unit has a first output terminal connected to the clock input terminal of the first flip-flop and a second output terminal connected to the clock input terminal of the second flip-flop. The clock control unit has a first input terminal connected to a first clock signal and a second input terminal connected to a second clock signal and outputs the first clock signal and the second clock signal in sequential order.

In an embodiment, the electronic device may include the above-described electronic circuit. The electronic device may be a mobile phone, a laptop, a netbook, a tablet PC, a game console, a TV, a DVD player, a GPS device, a camera, a voice recorder, MP3 player, MP4 player, PSP player, and other semiconductor devices including intermediate products and electronic components that contains such electronic device.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An electronic circuit comprising:
   a clock control unit comprising:
      a first clock input terminal for receiving a first clock signal;
      a second clock input terminal for receiving a second clock signal;
      a first clock output and terminal;
      a second clock output terminal;
      an inverter;
      a first multiplexer having a first select input terminal; and
      a second multiplexer having a second selected input terminal connected to the first selected terminal through the inverter;
   a first flip-flop comprising a first data input terminal, a first clock input terminal connected to the first clock output terminal of the clock control unit, and a first output terminal; and
   a second flip-flop comprising a second data output terminal, a second clock input terminal connected to the second clock output terminal of the clock control unit, and a second data input terminal connected to the first output terminal of the first flip-flop,
   wherein the clock control unit provides the first clock signal to the first clock input terminal of the first flip-flop through the first clock output terminal and the second clock signal to the second clock input terminal of the second flip-flop through the second clock output terminal in a sequential order, and
   wherein the first multiplexer comprises a first input terminal being the first clock input terminal of the clock control unit and a second input terminal being connected to a logical low level; and the second multiplexer comprises a second input terminal being the second input terminal of the clock control unit and a second input terminal connected to the logical low level.

2. The electronic circuit of claim 1, wherein the clock control unit further comprises an enable input terminal for receiving an enable signal, the clock control unit providing the first clock signal to the first clock input terminal of the first flip-flop through the first clock output terminal when the enable signal has a first logical state, and providing the second clock signal to the second clock input terminal of the second flip-flop through the second clock output terminal when the enable signal has a second, opposite logical state.

3. The electronic circuit of claim 2, wherein:
   when the enable signal has the first logical state, the first clock signal passes through the clock control unit, the second clock signal does not pass through the clock control unit, the passed through first clock signal causing the first flip-flop to pass a data signal at the first data input terminal to the first output terminal;
   when the enable signal has the second logical state, the first clock signal does not pass through the clock control unit, the second clock signal passes through the clock control unit causing the second flip-flop to process the data signal.

4. The electronic circuit of claim 2, wherein the enable signal and the first clock signal are located in a same clock domain and are substantially synchronous with respect to each other, and the first and second clock signals are located in different clock domains and asynchronous with respect to each other.

5. The electronic circuit of claim 1, wherein the first flip-flop and the second flip-flop are D flip-flops.

6. The electronic circuit of claim 1, wherein the first select input terminal or the second select input terminal is an enable input terminal of the clock control unit.

7. The electronic circuit of claim 1, wherein the first and second clock signals are asynchronous clock domain signals.

8. An electronic device comprising an electronic circuit, the electronic circuit comprising:
   a clock control unit comprising:
      a first clock input terminal for receiving a first clock signal;

a second clock input terminal for receiving a second clock signal;
a first clock output terminal;
a second clock output terminal; and
an enable input terminal for receiving an enable signal;
a first flip-flop comprising a first data input terminal, a first clock input terminal connected to the first output terminal, and a first clock output terminal; and
a second flip-flop comprising a second data output terminal, a second clock input terminal connected to the second clock output terminal, and a second data input terminal connected to the first output terminal of the first flip-flop,
wherein the clock control unit provides the first clock signal to the first clock input terminal of the first flip-flop through the first clock output terminal and the second clock signal to the second clock input terminal of the second flip-flop through the second clock output terminal in a sequential order,
wherein the first and second clock signals are located in different clock domains and asynchronous with respect to each other, and
wherein the clock control unit provides the first clock signal to the first clock input terminal of the first flip-flop through the first clock output terminal when the enable signal has a first logical state, and provides the second clock signal to the second clock input terminal of the second flip-flop through the second clock output terminal when the enable signal has a second logical state opposite from the first logical state.

9. The electronic device of claim 8, wherein:
when the enable signal has the first logical state, the first clock signal passes through the clock control unit, the second clock signal does not pass through the clock control signal unit, the passed through first clock signal causing the first flip-flop to pass a data signal at the first data input terminal to the first output terminal;
when the enable signal has the second logical state, the first clock signal does not pass through the clock control unit, the second clock signal passes through the clock control unit causing the second flip-flop to process the data signal.

10. The electronic device of claim 8, wherein the enable signal and the first clock signal are located in a same clock domain and are substantially synchronous with respect to each other.

11. The electronic device of claim 8, wherein the first flip-flop and the second flip-flop are D flip-flops.

12. The electronic device of claim 8, wherein the clock control unit further comprises:
an inverter;
a first multiplexer having a first select input terminal; and
a second multiplexer having a second selected input terminal connected to the first selected terminal through the inverter.

13. The electronic device of claim 12, wherein the first select input terminal or the second select input terminal is the enable input terminal of the clock control unit.

14. A method for eliminating metastability in a digital circuit comprising a first clock domain operating with a first clock signal and a second clock domain operating with a second clock signal, wherein the digital circuit comprises a clock control unit comprising a first multiplexer having a first output terminal and a second multiplexer having a second output terminal, a first flip-flop, and a second flip-flop, the method comprising, in a sequential order:
receiving the first clock signal at a first input terminal of the first multiplexer, the first multiplexer having a second input terminal connected to a logical low level;
receiving the second clock signal at a first input terminal of the second multiplexer, the second multiplexer having a second input terminal connected to the logical low level;
activating the first flip-flop by the first output terminal and deactivating the second flip-flop to transmit a data signal from the first flip-flop to the second flip-flop;
deactivating the first flip-flop and activating the second flip-flop by the second output terminal to process the transmitted data signal by the second flip-flop.

15. The method of claim 14, wherein activating the first flip-flop and deactivating the second flip-flop comprises receiving an enable signal having a first logical state by the clock control unit, and deactivating the first flip-flop and activating the second flip-flop comprises receiving the enable signal having a second logical state opposite from the first logical state.

16. The method of claim 15, wherein the enable signal and the first clock signal are located in the first clock domain and are substantially synchronous with respect to each other.

17. The method of claim 15, further comprising:
enabling the first multiplexer to provide the first clock signal to the first flip-flop and the second multiplexer to provide the logical low level to the second flip-flop in response to the first logical state of the enable signal; and
enabling the first multiplexer to provide the logical low level to the first flip-flop and the second multiplexer to provide the second clock signal to the second flip-flop in response to the second logical state of the enable signal.

* * * * *